United States Patent [19]
Tamatsuka et al.

[11] Patent Number: 6,139,625
[45] Date of Patent: Oct. 31, 2000

[54] METHOD FOR PRODUCING A SILICON SINGLE CRYSTAL WAFER AND A SILICON SINGLE CRYSTAL WAFER

[75] Inventors: Masaro Tamatsuka; Norihiro Kobayashi; Satoshi Oka, all of Annaka, Japan

[73] Assignee: Shin-Etsu Handotai Co., Ltd., Tokyo, Japan

[21] Appl. No.: 09/264,099

[22] Filed: Mar. 8, 1999

[30] Foreign Application Priority Data

Mar. 9, 1998 [JP] Japan .................................. 10-074867

[51] Int. Cl.[7] .................................................. C30B 15/04
[52] U.S. Cl. .................................................. 117/19; 117/13
[58] Field of Search .................................. 117/13, 19, 89, 117/102

[56] References Cited

U.S. PATENT DOCUMENTS 5,897,381  4/1999  Aronowitz et al. ..................... 438/798

FOREIGN PATENT DOCUMENTS

| | | | |
|---|---|---|---|
| 0170788A1 | 2/1986 | European Pat. Off. | C30B 15/04 |
| 0829559A1 | 3/1998 | European Pat. Off. | C30B 13/28 |
| 60-251190 | 12/1985 | Japan | C30B 15/04 |
| 2-267195 | 10/1990 | Japan | C30B 29/06 |
| 4-192345 | 7/1992 | Japan | H01L 21/66 |
| 5-294780 | 11/1993 | Japan | C30B 29/06 |

OTHER PUBLICATIONS

Watanabe, et al., "Controlled Oxygen Doping in Silicon," 14th International Conference on Solid State Devices and Materials; JP J. Applied Physics Supplement 22–1, vol 22, No. 22–1, pp. 185–189.

Maddalon–Vinante, C. et al., "Influence of Rapid Thermal Annealing and Internal Gettering on Czochralski–Grown Silicon. I. Oxygen Precipitation," Journal of Applied Physics, vol. 79, No. 5, Mar. 1, 1996, pp. 2707–2711.

Shimura, et al., "Nitrogen Effect on Oxygen Precipitation in Czochralski Silicon," Applied Physics Letters., vol. 48, No. 3, 1986, pp. 224–226.

Akito Hara, et al., "Enhancement of Oxygen Precipitation in Quenched Czochralski Silicon Crystals," Journal of Applied Physics, vol. 66, No. 8, Oct. 15, 1989, pp. 3958–3960.

Primary Examiner—Felisa Garrett
Attorney, Agent, or Firm—Hogan & Hartson, LLP

[57] ABSTRACT

There is disclosed a method of producing a silicon single crystal wafer wherein a silicon single crystal ingot in which nitrogen is doped is grown by Czochralski method, the single crystal ingot is sliced to yield a silicon single crystal wafer, and then the silicon single crystal wafer is subjected to heat treatment with a rapid heating/rapid cooling apparatus, and the silicon single crystal wafer produced by the method. There can be provided a method for producing a silicon single crystal wherein growth of crystal defects (grown-in defects) in silicon single crystal produced by CZ method are suppressed, particularly growth of crystal defects are prevented in the surface layer of the wafer, and crystal defect can be surely removed by a short time heat treatment even if small crystal defects are generated.

12 Claims, 4 Drawing Sheets

METHOD FOR PRODUCING A SILICON SINGLE CRYSTAL WAFER AND A SILICON SINGLE CRYSTAL WAFER

BACKGROUND OF THE INVENTION

1. Field of the Invention

The present invention relates to a method for producing a silicon single crystal wafer in high productivity wherein a size of crystal defect called grown-in defect inside the crystal is decreased by doping nitrogen when pulling a silicon single crystal by a Czochralski method (hereinafter referred to as "CZ method"), and crystal defects on the surface of wafer are eliminated by subjecting the wafer to a high temperature heat treatment with a rapid heating/rapid cooling apparatus, and the silicon single crystal wafer produced by the method.

2. Description of the Related Art

As a wafer for fabrication of a device such as a semiconductor integrated circuit, a silicon single crystal wafer grown by a Czochralski method (CZ method) is mainly used. When crystal defects are present in such a silicon single crystal wafer, pattern failure is caused when a semiconductor device is fabricated. Particularly, the pattern width of devices which is highly integrated in recent years is very fine as 0.35 µm or less. Accordingly, even small crystal defects as 0.1 µm may cause defects such as pattern failures in the device, and may remarkably lower a yield and characteristics of the device. Accordingly, the crystal defects in the silicon single crystal wafer have to be decreased as thoroughly as possible.

Recently, it has been reported that the above-mentioned crystal defects called grown-in defect incorporated during growth of the crystal are found in the silicon single crystal grown by CZ method by various measurement methods. For example, these crystal defects in a single crystal grown at a general growth rate in commercial production (for example, about 1 mm/min or more) can be detected as a pit by subjecting the surface of the crystal to preferential etching (Secco etching) with Secco solution (a mixture of $K_2Cr_2O_7$, hydrofluoric acid and water) (See Japanese Patent Application Laid-open (kokai) No.4-192345).

The main cause of generation of the pit is considered to be a cluster of vacancies which is aggregated in manufacture of single crystal or an oxide precipitate which is an agglomerate of oxygen atoms incorporated from a quartz crucible. When these crystal defects are present in the surface portion (0 to 5 µm) in which a device is formed, they degrade characteristics of the device. Accordingly, various methods for reducing these crystal defects have been studied.

For example, it is known that a density of the above-mentioned cluster of vacancies can be lowered by decreasing a growth rate of the crystal extremely (for example, to 0.4 mm/min or less) (See Japanese Patent Application Laid-open (kokai) No.2-267195). However, adopting this method there is generated a crystal defect which is considered to be a dislocation loop formed as a result of new aggregation of excess interstitial silicon atoms, which may degrade characteristics of a device significantly. Accordingly, the problem cannot be solved by the method. Furthermore, productivity of the single crystal and cost performance are extremely decreased in the method, since the growth rate of the crystal is decreased from about 1.0 mm/min as usual or more to 0.4 mm/min or less.

In order to reduce crystal defects due to oxide precipitate in the surface portion of the wafer, there is a method of dissolving and eliminating oxide precipitates by subjecting the wafer to a heat treatment at a high temperature as 1100° C. or more to out-diffuse oxygen in the crystal. However, a heat treatment has to be conducted for a long time as 4 hours or more in the method, and thus disadvantageous from the point of productivity and cost performance. Furthermore, the intended purpose or advantages cannot be achieved by the method in many cases, since it takes long time to increase or decrease a temperature of the wafer, and oxide precipitates are formed in the device fabricating layer when increasing or decreasing temperature.

SUMMARY OF THE INVENTION

The present invention has been accomplished to solve the above-mentioned problems, and an object of the present invention is to provide a method for producing a silicon single crystal wafer having a very small amount of defects easily and in high productivity wherein growth of crystal defects (grown-in defects) in silicon single crystal produced by CZ method are suppressed, particularly generation of crystal defects are prevented in the surface layer of the wafer, and crystal defect can be surely removed by a short time heat treatment even if small crystal defects are generated.

To achieve the above object, the present invention provides a method of producing a silicon single crystal wafer wherein a silicon single crystal ingot in which nitrogen is doped is grown by Czochralski method, the single crystal ingot is sliced to yield a silicon single crystal wafer, and then the silicon single crystal wafer is subjected to heat treatment with a rapid heating/rapid cooling apparatus.

As mentioned above, growth of the crystal defect incorporated during growing the single crystal can be suppressed by doping nitrogen when a single crystal ingot is grown by CZ method. Furthermore, since the growth rate of crystal can be increased as a result of suppression of growth of the crystal defects, productivity of crystal can be significantly improved.

When the wafer sliced from the silicon single crystal in which nitrogen is doped is subjected to a heat treatment with a rapid heating/rapid cooling apparatus, oxygen and nitrogen in the surface layer of the wafer are out-diffused, so that crystal defects in the surface layer of the wafer can be efficiently eliminated. Accordingly, a silicon single crystal wafer having a very small amount of crystal defects on the surface thereof can be obtained. Furthermore, since increasing and decreasing of temperature can be conducted rapidly, crystal defects due to oxide precipitates are not generated newly while increasing or decreasing the temperature, and time required for heat treatment can be significantly shortened.

Since oxygen precipitation is accelerated by the presence of nitrogen in the bulk portion of the wafer, the wafer which is excellent in so-called intrinsic gettering effect (IG effect) can be produced.

When a silicon single crystal ingot wherein nitrogen is doped is grown by Czochralski method, concentration of doped nitrogen is preferably $1\times10^{10}$~$5\times10^{15}$ atoms/$cm^3$.

Because, nitrogen concentration of $1\times10^{10}$ atoms/$cm^3$ or more is preferable for sufficient suppression of growth of crystal defects, and nitrogen concentration of $5\times10^{15}$ atoms/$cm^3$ or less is preferable in order not to impede crystallization of silicon single crystal.

When a silicon single crystal ingot wherein nitrogen is doped is grown by Czochralski method, oxygen concentration in the single crystal ingot is preferably $1.2\times10^{18}$/$cm^3$ (value according to ASTM'79) or less.

As described above, lower oxygen concentration enables further suppression of growth of crystal defect, and prevention of formation of oxide precipitates in the surface layer. In the bulk portion, oxygen precipitation is accelerated due to presence of nitrogen, and thus sufficient IG effect can be achieved even when oxygen concentration is low.

In an embodiment of the present invention, the heat treatment of the wafer with the rapid heating/rapid cooling apparatus is conducted at a temperature of 1100° C. to a melting point of silicon for 1 to 60 seconds.

When the heat treatment of the wafer with the rapid heating/rapid cooling apparatus is conducted at high temperature of from 1100° C. to a melting point of silicon, oxygen and nitrogen in the surface layer of the wafer can be out-diffused sufficiently, and thereby crystal defect can be surely eliminated, and a heat treatment time as 60 seconds or less can be shortened.

In an embodiment of the present invention, heat treatment of the wafer with the rapid heating/rapid cooling apparatus is preferably conducted in an atmosphere of oxygen, hydrogen, argon or a mixed atmosphere thereof.

When conducting the heat treatment in such an atmosphere, oxygen and nitrogen can be effectively out-diffused without forming a surface coating film which is harmful for silicon wafer, and thereby crystal defect in the surface layer of the wafer can be eliminated.

The silicon single crystal wafer produced by a method of producing according to the present invention has a very small amount of crystal defect. The density of crystal defect on the surface of the wafer can be 10 number/cm$^2$ (defects/cm$^2$) or less, and a density of COP in the area from the surface of the wafer to the depth of 0.2 µm can be $8.0 \times 10^4$ number/cm$^3$ or less, and thereby yield in fabrication of a device is significantly improved.

According to the present invention, growth of crystal defect in a silicon single crystal produced by CZ method can be suppressed by subjecting a silicon single crystal wafer in which nitrogen is doped to heat treatment with a rapid heating/rapid cooling apparatus, and crystal defect in the surface layer of the wafer can be eliminated. Accordingly, a silicon single crystal wafer having quite low defect can be easily produced in high productivity.

DESCRIPTION OF THE INVENTION AND EMBODIMENT

Figure 1:
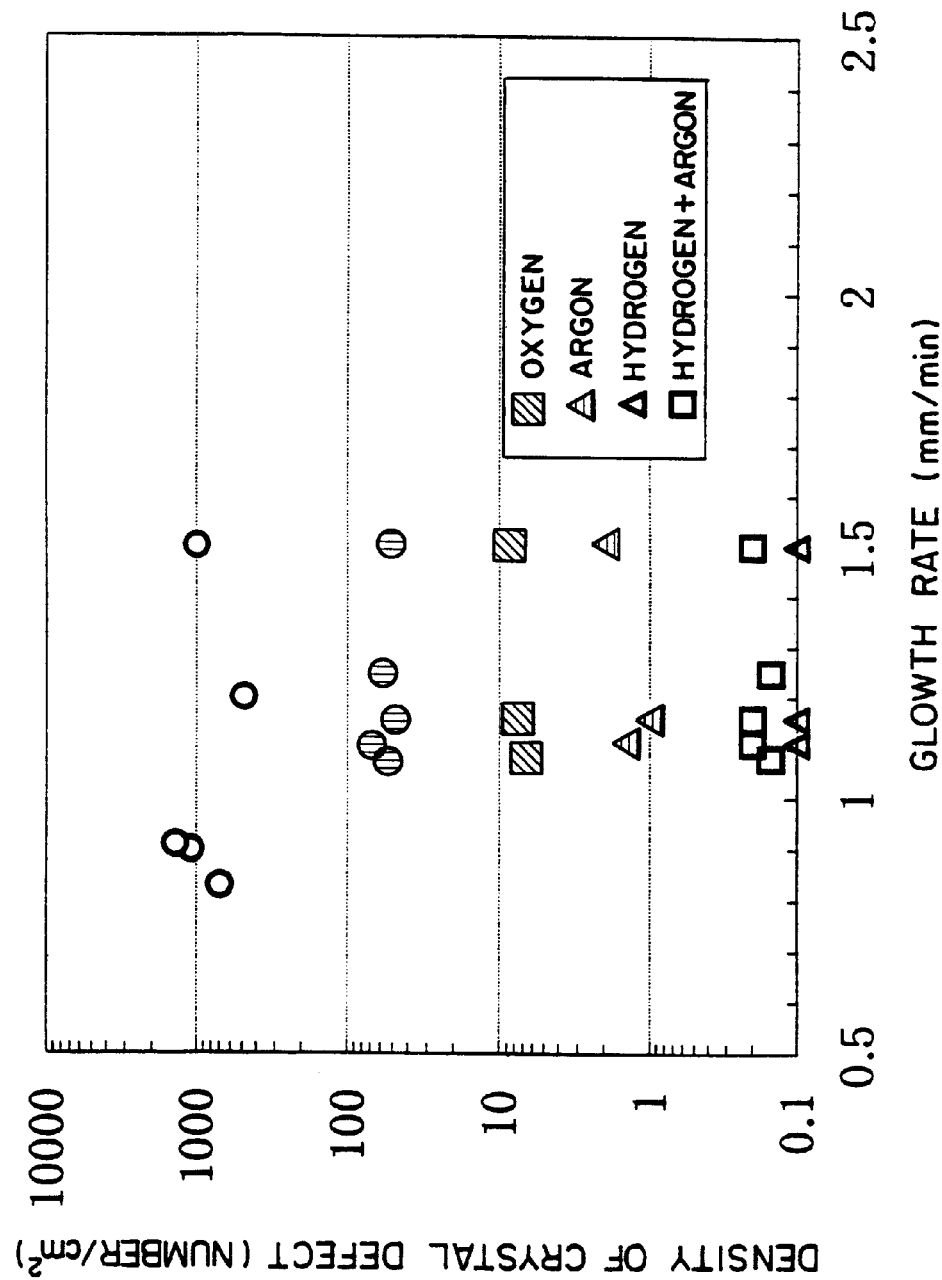
FIG. 1 is a graph showing a result of measurement of a pit density on the surface of the wafer by observing with a microscope after Secco etching in Example 1 and Comparative Example 1, and a effect of a heat treatment (black circles show the result of the present method wherein nitrogen is doped, white circles show a conventional method wherein nitrogen is not doped).

The present invention will now be described in more detail. However, the invention is not limited thereto.

The inventors have found that a silicon single crystal wafer having a very small amount of crystal defects in a device fabricating layer (the surface layer of the wafer) can be obtained in high productivity by combining a technology of doping nitrogen while growing a silicon single crystal by CZ method, and a technology of eliminating crystal defects on the surface of the wafer by subjecting a silicon single crystal wafer to heat treatment with a rapid heating/rapid cooling apparatus, and have accomplished the present invention by studying the conditions.

Namely, it is reported that agglomeration of vacancies in the silicon is suppressed when nitrogen is doped in a silicon single crystal so that a size of a crystal defect is decreased (T. Abe and H. Takeno, Mat. Res. Soc. Symp. Proc. Vol. 262, 3, 1992). It is considered that the effect can be achieved as a result of vacancy agglomeration process is transited from homogenous nuclei formation to heterogeneous nuclei formation. Accordingly, the silicon single crystal having very small crystal defect can be obtained by growing a silicon single crystal by CZ method with doping nitrogen, and thus the silicon single crystal wafer having very small crystal defect can be obtained by processing it. According to the method, it is not always necessary to decrease growth rate of crystal, not as in the conventional method, and thus a silicon single crystal wafer can be produced in high productivity.

However, it is known that a nitrogen atom in the silicon single crystal accelerates oxygen precipitation (for example, in F. Shimura and R. S. Hockett, Appl. Phys. Lett. 48, 224, 1986). When nitrogen is doped in the silicon single crystal grown by CZ method, there are caused a lot of defects due to oxygen precipitation such as OSF (oxidation-induced stacking fault) during fabrication of the device. Accordingly, CZ silicon single crystal wafer in which nitrogen is doped has not been conventionally used as a wafer for fabrication of the device.

In the present invention, with enjoying an advantage that crystal defect (grown-in defect) hardly grows when nitrogen is doped in the crystal, defects due to accelerated oxygen precipitation can be prevented by out-diffusing oxygen and nitrogen in the surface layer with high temperature heat treatment to succeed in obtaining a silicon single crystal wafer having a very small amount of crystal defects on the surface of the wafer.

Since oxygen precipitation is accelerated due to nitrogen contained in a bulk portion of the wafer, more precipitates are present than the ordinal wafer containing no nitrogen having the same oxygen concentration, and thus IG effect is enhanced. Accordingly, oxygen concentration can be reduced in the present wafer, so that generation of crystal defects on the surface can be further suppressed.

Furthermore, there can be obtained an advantage of high productivity, since it is not necessary to reduce the pulling rate of crystal in CZ method.

In the present invention, a silicon single crystal ingot in which nitrogen is doped can be grown by CZ method according to the known method such as disclosed in, for example, Japanese Patent Application Laid-open (kokai) No 60-251190.

Namely, in CZ method comprising contacting a seed crystal with a melt of polycrystal silicon raw material contained in a quartz crucible, pulling it with rotating to grow a silicon single crystal ingot having an intended diameter, nitrogen can be doped in a silicon single crystal by placing nitride previously in the quartz crucible, adding nitride into the silicon melt, or by using an atmosphere gas containing nitrogen. A doping amount in the crystal can be controlled by controlling an amount of nitride, concentration or time of introduction of nitrogen gas.

As described above, growth of crystal defect introduced during growth of crystal can be suppressed by doping nitrogen when growing a single crystal ingot by CZ method. Furthermore, it in not necessary to reduce growth rate of crystal to, for example, 0.4 mm/min or less for suppression of generation of crystal defect, so that productivity of crystal can be improved significantly.

The reason of why growth of crystal defect introduced in silicon can be suppressed is considered to be that vacancy agglomeration process is transited from homogenous nuclei formation to heterogeneous nuclei formation.

Accordingly, concentration of nitrogen which is doped is preferably $1 \times 10^{10}$ atoms/cm$^3$ or more, especially $5 \times 10^{13}$ atoms/cm$^3$ or more, at which heterogeneous nuclei formation is caused sufficiently.

Furthermore, when nitrogen concentration is more than $5 \times 10^{15}$ atoms/cm$^3$ which is solid solubility of nitrogen in silicon single crystal, crystallization of single crystal is inhibited. Accordingly, the concentration is controlled so as not to exceed the value.

When a silicon single crystal ingot in which nitrogen is doped is grown by CZ method in present invention, oxygen concentration contained in a single crystal ingot is preferably $1.2 \times 10^{18}$ atoms/cm$^3$ or less.

Such a low oxygen concentration and presence of nitrogen together enables further suppression of growth of crystal defect, and suppression of formation of OSF mentioned above.

Oxygen concentration can be lowered so as to fall in the above range by a conventional method, when a silicon single crystal ingot is grown. For example, oxygen concentration can be easily controlled to fall in the above mentioned range by reducing the number of rotation of a crucible, increasing gas volume of flowing, lowering an atmosphere pressure, controlling temperature distribution and convection of a silicon melt or the like.

The silicon single crystal ingot wherein nitrogen is doped in a desirable concentration and oxygen is contained in a desirable concentration in CZ method can be thus obtained. After it is sliced with a slicing apparatus such as an inner diameter blade slicer, a wire saw or the like, it is subjected to processes such as chamfering, lapping, etching, polishing or the like to be a silicon single crystal wafer. Of course, such processes are merely examples, and other processes such as cleaning or the like can be conducted, and process can be changed appropriately depending on the purpose, namely, order of processes can be changed, and some processes can be omitted.

Then, the silicon single crystal wafer is subjected to heat treatment through use of the rapid heating/rapid cooling apparatus to out-diffuse oxygen and nitrogen in surface layer of the wafer to eliminate crystal defect.

The rapid heating/rapid cooling means, for example, a method that a wafer is immediately loaded into a heat treatment furnace in which a temperature is arranged in the predetermined range, and is immediately loaded out upon elapse of the predetermined heat treatment time, or a method that a wafer is immediately subjected to heat treatment with a lamp heater or the like after it is arranged at a predetermined position in the heat treatment furnace. The language reading "immediately loaded into" or "immediately loaded out" means that there are not performed an operation for raising and lowering the temperature over a certain period, as well as a conventional so-called loading or unloading operation in which a wafer is slowly loaded into the heat treatment furnace and slowly loaded out. Of course, it takes a certain time to bring a wafer to a predetermined position in the furnace, for example, several seconds to several minutes depending on capability of a transfer apparatus for loading of a wafer.

Examples of a rapid heating/rapid cooling apparatus used in the present invention include a heater such as a lamp heater with heat radiating. An example of commercially available apparatuses is SHS-2800 (product of AST corp.). These apparatuses are neither extremely complicated nor expensive.

Figure 3:
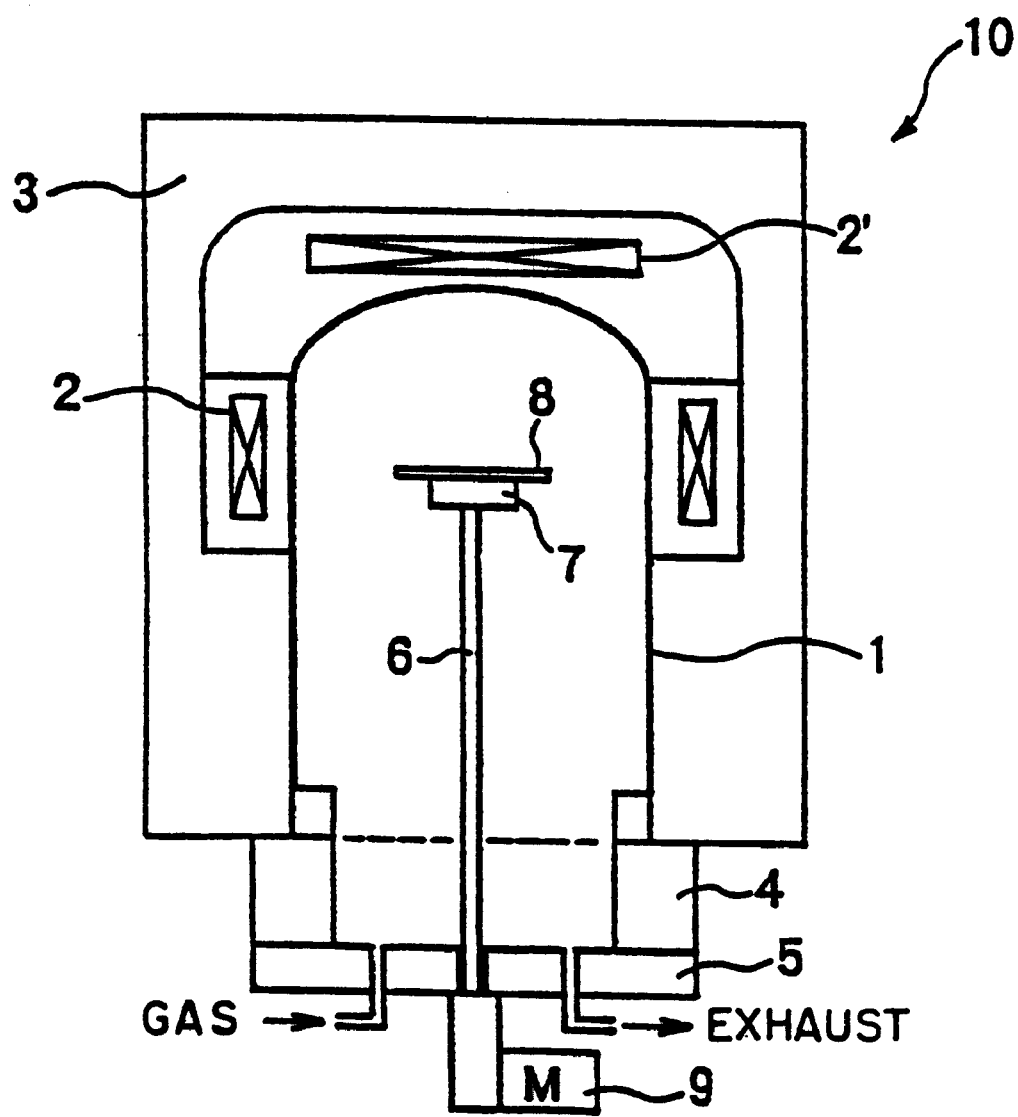
FIG. 3 is a schematic view of an example of an apparatus for a rapid heating/rapid cooling treatment of a silicon wafer.

First, a description will be given of rapid heating/rapid cooling apparatus used in the present invention. FIG. 3 is schematic view of a rapid heating/rapid cooling apparatus.

A heat-treatment furnace 10 shown in FIG. 3 includes a bell jar 1 which is formed from, for example, silicon carbide or quarts and in which a wafer is heat-treated. Heaters 2 and 2' surround the bell jar 1 so as to heat the bell jar 1. The heater is separated along a vertical direction. Also, power supplied to each heater can be controlled independently. The heating method is not limited thereto, but so-called radiation heating and induction heating may also be applicable. A housing 3 as a heat shield is provided around the heaters 2 and 2'.

A water-cooled chamber 4 and a base plate 5 are arranged at the lower portion of a furnace so as to isolate the interior of the bell jar 1 from the atmosphere. A wafer 8 is held on a stage 7, which is attached to the top end of a support shaft 6, which, in turn, is moved vertically by means of a motor 9. In order to load a wafer into or unload from the furnace along a horizontal direction, the water-cooled chamber 4 has an unillustrated wafer port which is opened and closed by means of a gate valve. A gas inlet and a gas outlet are provided in the base plate 5 so that the gas atmosphere within the furnace can be adjusted.

In the heat treatment furnace 10 having the above-described structure, heat treatment for rapid heating/rapid cooling of a silicon wafer is carried out in the procedure described below.

First, the interior of the bell jar 1 is heated to a desired temperature of 1100° C. to a melting point of silicon by the heaters 2 and 2' in a desired atmosphere and is then held at the desired temperature. Through mutually independent control on power supplied to the heaters, a temperature distribution can be established within the bell jar 1 along a vertical direction. Accordingly, the heat-treatment temperature of a wafer is determined by the position of the stage 7, i.e. the amount of insertion of the support shaft 6 into the furnace.

In a state in which the interior of the bell jar 1 is maintained at a desired temperature, a wafer is inserted into the water-cooled chamber 4 through the wafer port by an unillustrated wafer handling apparatus arranged next to the heat treatment furnace 10. The inserted wafer is placed on, for example, a SiC boat provided on the stage 7 which is situated at the bottom standby position. Since the water-cooled chamber 4 and the base plate 5 are water-cooled, the wafer located at this standby position is not heated to a high temperature.

Upon completion of placing the wafer on the stage 7, the motor 9 is immediately driven to insert the support shaft 6 into the furnace so that the stage 7 is raised to a heat treatment position where a desired temperature in the range of 1100° C. to a melting point of silicon is established, thereby heat-treating the wafer at the temperature. In this case, since only approximately 20 seconds, for example, is required for moving the stage 7 from the bottom standby position in the wafer-cooled chamber 4 to the heat treatment position, the silicon wafer is heated quickly.

The stage 7 is halted at the desired temperature position for a predetermined time (for example, 1 to 60 seconds), thereby subjecting the wafer to high-temperature heat treatment over the halting time. Upon elapse of the predetermined time to complete high-temperature heat treatment, the motor 9 is immediately driven to withdraw the support shaft 6 from the interior of the furnace to thereby lower the stage 7 to the bottom standby position in the water-cooled chamber 4. This lowering motion can be completed in approximately 20 seconds, for example. The wafer on the stage 7 is quickly cooled, since the water-cooled chamber 4 and the base plate 5 are water-cooled. Finally, the wafer is unloaded from inside the water-cooled chamber 4 by the wafer handling apparatus, thus completing the heat treatment.

When there are more wafers to be heat-treated, these wafers can be sequentially loaded into and heat-treated in the heat treatment furnace 10 maintained at a predetermined high temperature.

The condition of heat treatment of the wafer of the present invention through use of the above-described rapid heating/rapid cooling apparatus is preferably a temperature of from 1100° C. to a melting point of silicon and treatment time from one to 60 seconds.

Oxygen and nitrogen in the surface layer of the wafer are out-diffused sufficiently, when the heat treatment is conducted in a high temperature of from 1100° C. to a melting point of silicon so that crystal defects can be surely eliminated, and extremely short heat treatment time as 60 seconds or less can be achieved.

The time of from one to 60 seconds is determined by the following reason. At least one second is necessary for sufficient out-diffusion of oxygen and nitrogen, and 60 seconds are enough therefor.

Furthermore, since rapid heating and rapid cooling are possible, new crystal defect or new oxygen precipitation are not caused.

As the heat treatment atmosphere, oxygen gas, hydrogen gas, argon gas or a mixed atmosphere thereof may be selected in order to out-diffuse oxygen and nitrogen effectively without forming surface coating of film which is harmful for silicon wafer, and thereby crystal defect in the surface layer of the wafer can be eliminated.

Particularly, high temperature heat treatment in a non-oxidizing or reducing atmosphere such as hydrogen gas, argon gas or a mixed atmosphere thereof is preferable, since the crystal defects on the surface of the wafer can be easily eliminated thereby. It is confirmed that slip dislocation hardly generates in the wafer during the heat treatment in a mixed atmosphere of hydrogen and argon.

There can be thus produced a silicon single crystal wafer manufactured by CZ method with doping nitrogen in which a very small amount of crystal defects are present on the surface of the silicon single crystal wafer. Particularly, a density of crystal defect on the surface of the wafer can be reduced to 10 number/cm$^2$ or less, or can be reduced to substantially 0.

Furthermore, COP density in the area from the surface of the wafer to the depth of 0.2 μm can be 8×10$^4$ number/cm$^3$ or less. Accordingly, yield of the device can be surely improved.

EXAMPLES

The following examples and comparative examples are being submitted to further explain the present invention. These examples are not intended to limit the scope of the present invention.

Example 1, Comparative Example 1

In accordance with CZ method, 40 kg of polycrystalline material of silicon was charged into a quartz crucible having a diameter of 18 inches, ten single crystal ingots of silicon having a diameter of 6 inches and orientation <100> were pulled, while the pulling rate was varied over the range between 0.8 mm/min and 1.5 mm/min as usual value. Five of them were pulled while silicon wafer having 0.12 g of silicon nitride film is previously charged. Other five of them were pulled without doping nitrogen. The number of rotation of the crucible was controlled so that oxygen concentration in the single crystal is 0.9 to 1.0×10$^{18}$ atoms/cm$^3$ when pulling any of them.

Nitrogen concentration in the tail part of the crystal ingots in which nitrogen was doped as measured by FT-IR was 5.0×10$^{14}$ atoms/cm$^3$ on the average (segregation coefficient of nitrogen is very small, concentration in the straight body of the crystal ingot will be lower than the value). oxygen concentration of all crystal ingots as measured by FT-IR was approximately 0.9 to 1.0×10$^{18}$ atoms/cm$^3$ in any of them.

The wafers were sliced from the single crystal ingot thus obtained with a wire saw, and subjected to chamfering, lapping, etching, and mirror polishing. All of them were produced in almost the same condition except that nitrogen is doped or not. Two kinds of silicon single crystal mirror polished wafer having a diameter of 6 inches were fabricated.

The silicon single crystal wafer thus obtained was subjected to Secco etching, pit density was measured by observing the surface thereof with a microscope to determine a density of crystal defect (grown-in defect).

The results were shown in FIG. 1. Black circles represent the result as for the method of the present invention. White circles represent the result as for the conventional method.

The result shows that the density of crystal defect of the wafer in which nitrogen was doped obtained by the method of the present invention was decreased to one twentieth of the density of the wafer obtained by the conventional method, even though it was pulled at a pulling rate of 1.0 mm/min or more which is the same as in the conventional method or more. Namely, it is apparent that growth of the crystal defects is suppressed by doping nitrogen, and thereby the number of crystal defects which have been grown so large that they can be detected is decreased.

Then, the wafers were subjected to rapid heating/rapid cooling treatment at 1200° C. for 10 seconds through use of the rapid heating/rapid cooling apparatus as shown in FIG. 3 in atmosphere of 100% oxygen, 100% argon, 100% hydrogen, or a mixed atmosphere of 50% argon and 50% hydrogen.

The wafer subjected to the above heat treatment was then subjected to Secco etching, and pit density was measured again by observing the surface thereof with a microscope to determine whether density of crystal defect was changed or not.

The results in the case that nitrogen was doped were plotted in FIG. 1.

The result shows that the density of crystal defect on the surface of the wafer in which nitrogen was doped was decreased to about 10 number/cm$^2$ or less after rapid heating/rapid cooling treatment.

Namely, nitrogen and oxygen are out-diffused by the heat treatment so that the crystal defect on the surface of the wafer was eliminated. The density of crystal defect can be decreased to substantially 0.

Then, oxide dielectric breakdown voltage characteristics (C-mode) of the wafer subjected to the above heat treatment was measured.

Oxide dielectric breakdown voltage characteristics (C-mode) was measured under the following condition. Thickness of the oxide film: 25 nm, electrode for measurement: phosphorus doped polysilicon, electrode area: 8 mm$^2$, electric current density in decision: 1 mA/cm$^2$.

Figure 2:
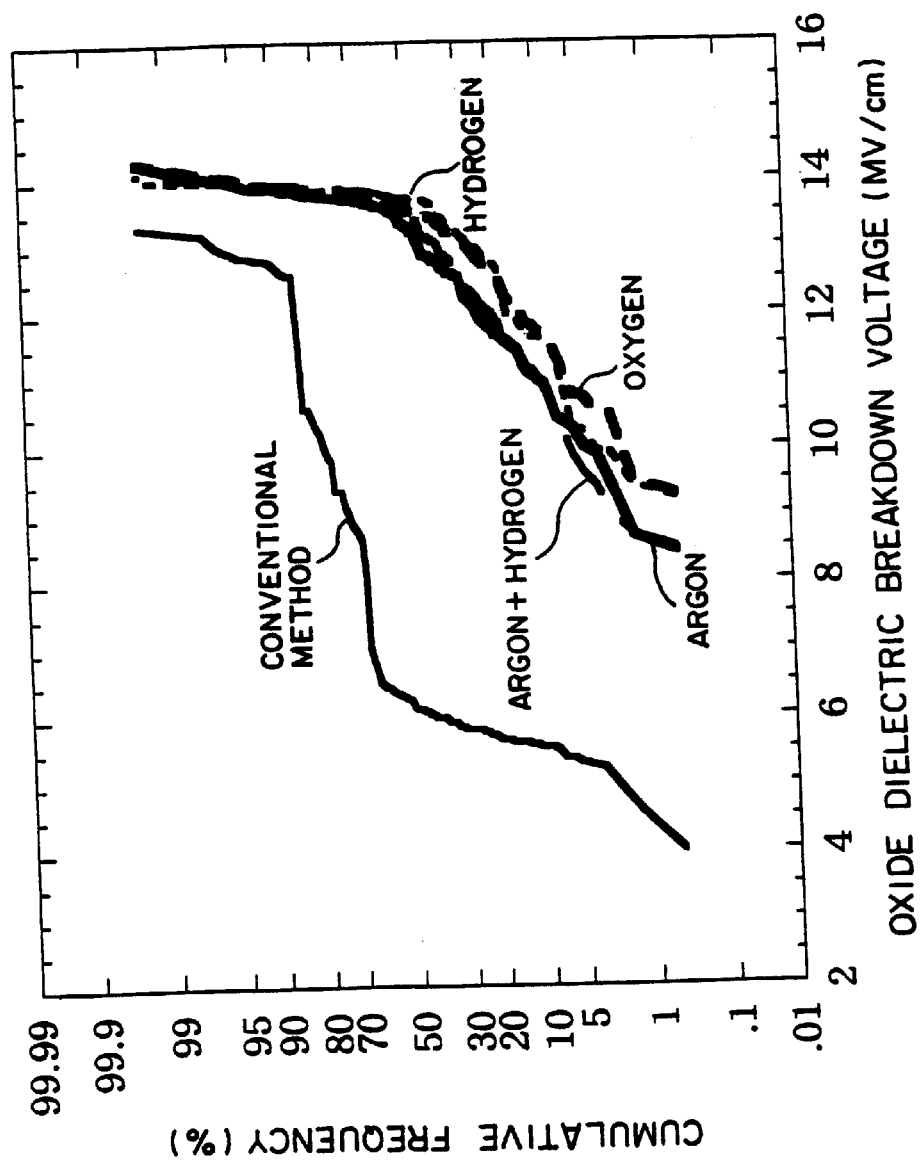
FIG. 2 is a graph showing a result of measurement of oxide dielectric breakdown voltage characteristic (C-mode) of a wafer after heat treatment.

Generally, the wafer having dielectric breakdown electric field of 8 Mv/cm or more is determined as a good chip. The result of measurement was shown in FIG. 2.

The silicon single crystal wafer of the present invention which contains doped nitrogen and is subjected to the rapid heating/rapid cooling treatment, as shown in curved lines A to D, can be good chips having oxide dielectric breakdown voltage of 8 mV/cm or more in high percentage in any heat treatment atmosphere. According to the conventional method, as shown in curved line E, fail chips having oxide dielectric breakdown voltage less than 8 mV/cm are produced in a rate of about 70%.

Example 2, Comparative Example 2

Five single crystal ingots of p-type having a diameter of 8 inches and orientation <100> were pulled by CZ method as in the similar manner to Example 1 and Comparative Example 1 in accordance with condition shown in Table 1. Five kinds of silicon single crystal mirror polished wafer having a diameter of 8 inches (a, b, c, d, e) were fabricated.

TABLE 1

|  |  | Nitrogen Concentration (atoms/cm$^3$) | Oxygen Concentration (atoms/cm$^3$) | Pulling Rate (mm/min) |
| --- | --- | --- | --- | --- |
| Example 2 | a | 2 × 10$^{14}$ | 1.3 × 10$^{18}$ | 1.8 |
|  | b | 2 × 10$^{14}$ | 0.8 × 10$^{18}$ | 1.7 |
|  | c | 3 × 10$^{13}$ | 0.8 × 10$^{18}$ | 1.6 |
| Comparative | d | 0 | 1.3 × 10$^{18}$ | 0.95 |
| Example 2 | e | 0 | 0.7 × 10$^{18}$ | 1.6 |

The number of COP (Crystal Originated Particle) which is crystal defect considered to be a cluster of vacancies on the surface of five kinds of the wafer thus obtained was measured.

COP was measured by forming thermal oxide film having a thickness of about 0.44 μm, removing the oxide film with hydrofluoric acid, and COPs of a diameter of 0.10 μm or more which are present on the surface of the wafer were counted by a particle counter (manufactured by KLA/Tencor Corporation, SP1). By the method, an integral value of COP which are present in the area from the surface of the wafer to the depth of about 0.2 μm can be measured.

The other set of five kinds of the wafer is subjected to the heat treatment at 1200° C., for 10 seconds in a mixed atmosphere of 50% argon and 50% hydrogen through use of rapid heating/rapid cooling apparatus (manufactured by AST Corporation, SHS-2800). Then, thermal oxide film of about 0.44 μm was formed as shown above, and the oxide film was removed. Thereafter, COP was measured. The result of the number of COP thus measured was shown in FIG. 4.

Figure 4:
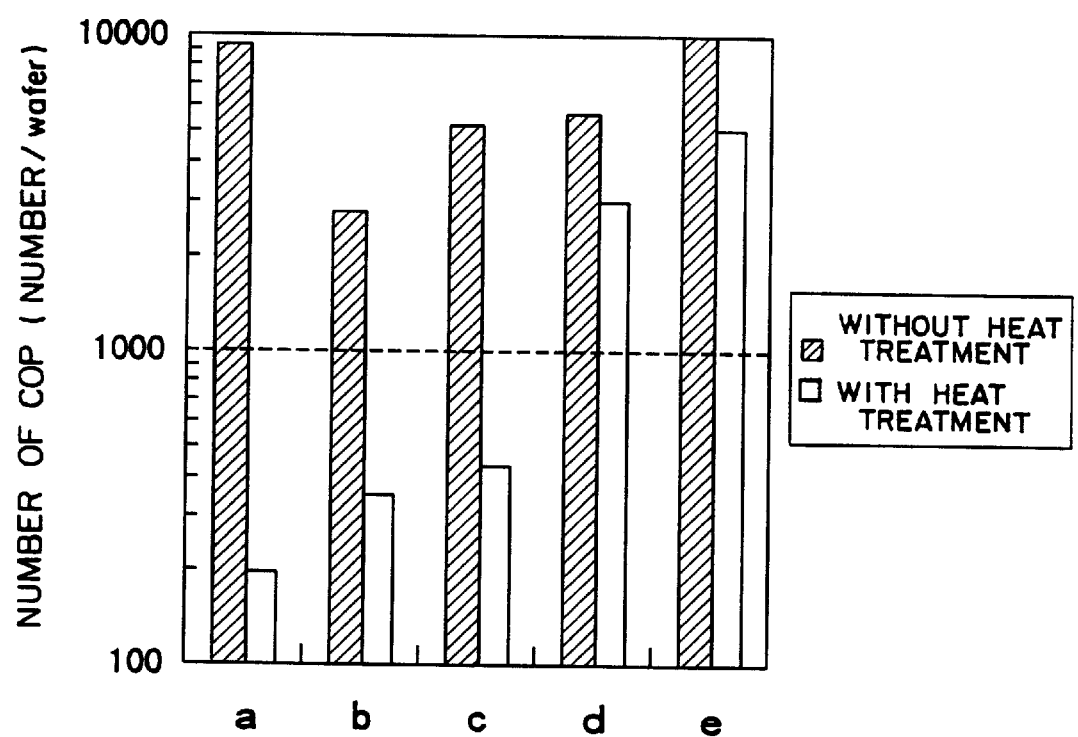
FIG. 4 is a graph showing a result of Example 2 and Comparative Example 2.

FIG. 4 clearly shows that the effect of reducing COP by the heat treatment with the rapid heating/rapid cooling apparatus is larger in the wafer in which nitrogen is doped (a, b, c in FIG. 4) than in the wafer in which nitrogen is not doped (d, e in FIG. 4).

Furthermore, it was found that the number of COP in the area from the surface to the depth of 0.2 μm of the wafer of 8 inches can be surely reduced to 500 number/wafer (COPs/wafer) or less, namely, COP density of about 8×10$^4$ number/cm$^3$ (COPs/cm$^3$) or less.

The present invention is not limited to the above-described embodiment. The above-described embodiment is a mere example, and those having the substantially same structure as that described in the appended claims and providing the similar action and effects are included in the scope of the present invention.

For example, when silicon single crystal ingot in which nitrogen is doped is grown by Czochralski method, a magnetic field may be applied to a melt or not. In the specification of the present invention, the term of Czochralski method also means so-called MCZ method wherein a magnetic field is applied.

Furthermore, although it was shown above that lower density of crystal defect can be achieved when oxygen concentration is low, the present invention is not limited thereto, and can achieve the effect even when oxygen concentration is 1.2 to 1.5×10$^{18}$ atoms/cm$^3$, or more.

What is claimed is:

1. A method of producing a silicon single crystal wafer wherein a silicon single crystal ingot in which nitrogen is doped is grown by Czochralski method, the single crystal ingot is sliced to provide a silicon single crystal wafer, and then the silicon single crystal wafer is subjected to heat treatment with a rapid heating/rapid cooling apparatus.

2. The method for producing a silicon single crystal wafer according to claim 1 wherein concentration of nitrogen doped in a single crystal ingot is 1×10$^{10}$ to 5×10$^{15}$ atoms/cm$^3$ when a silicon single crystal ingot wherein nitrogen is doped is grown by Czochralski method.

3. The method for producing a silicon single crystal wafer according to claim 2 wherein oxygen concentration in the single crystal ingot is 1.2×10$^{18}$ atoms/cm$^3$ or less when a silicon single crystal ingot wherein nitrogen is doped is grown by Czochralski method.

4. The method for producing a silicon single crystal wafer according to claim 3 wherein the heat treatment of the wafer with a rapid heating/rapid cooling apparatus is conducted at a temperature of 1100° C. to a melting point of silicon for 1 to 60 seconds.

5. The method for producing a silicon single crystal wafer according to claim 2 wherein the heat treatment of the wafer with a rapid heating/rapid cooling apparatus is conducted at a temperature of 1100° C. to a melting point of silicon for 1 to 60 seconds.

6. The method for producing a silicon single crystal wafer according to claim 1 wherein oxygen concentration in the single crystal ingot is 1.2×10$^{18}$ atoms/cm$^3$ or less when a silicon single crystal ingot wherein nitrogen is doped is grown by Czochralski method.

7. The method for producing a silicon single crystal wafer according to claim 6 wherein the heat treatment of the wafer with a rapid heating/rapid cooling apparatus is conducted at a temperature of 1100° C. to a melting point of silicon for 1 to 60 seconds.

8. The method for producing a silicon single crystal wafer according to claim 1 wherein the heat treatment of the wafer with a rapid heating/rapid cooling apparatus is conducted at a temperature of 1100° C. to a melting point of silicon for 1 to 60 seconds.

9. The method for producing a silicon single crystal wafer according to any of claim 1 wherein the heat treatment of the wafer with a rapid heating/rapid cooling apparatus is conducted in an atmosphere of oxygen, hydrogen, argon or a mixed atmosphere thereof.

10. A silicon single crystal wafer produced by a method of claims 1.

11. The silicon single crystal wafer according to claim 10 in which density of crystal defect on the surface of the wafer is 10 number/cm$^2$ or less.

12. The silicon single crystal wafer according to claim 10 in which a density of COP in the area from surface of the wafer to the depth of 0.2 $\mu$m is $8.0 \times 10^4$/cm$^3$ or less.

* * * * *